US012672451B2

(12) United States Patent
Kim

(10) Patent No.: US 12,672,451 B2
(45) Date of Patent: Jun. 30, 2026

(54) ELECTROLUMINESCENCE DISPLAY

(71) Applicant: LG Display Co., Ltd., Seoul (KR)

(72) Inventor: Choonghyo Kim, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 741 days.

(21) Appl. No.: 17/943,959

(22) Filed: Sep. 13, 2022

(65) Prior Publication Data

US 2023/0200169 A1 Jun. 22, 2023

(30) Foreign Application Priority Data

Dec. 21, 2021 (KR) ........................ 10-2021-0183984

(51) Int. Cl.
| | |
|---|---|
| *H10K 59/131* | (2023.01) |
| *H10K 50/824* | (2023.01) |
| *H10K 59/35* | (2023.01) |
| *H10K 59/80* | (2023.01) |
| *H10K 71/00* | (2023.01) |
| *H10K 102/00* | (2023.01) |

(52) U.S. Cl.
CPC ....... *H10K 59/1315* (2023.02); *H10K 50/824* (2023.02); *H10K 59/80521* (2023.02); *H10K 59/80522* (2023.02); *H10K 59/351* (2023.02); *H10K 71/861* (2023.02); *H10K 2102/3026* (2023.02)

(58) Field of Classification Search
CPC ................... H10K 59/80522; H10K 59/80521
See application file for complete search history.

(56) References Cited

U.S. PATENT DOCUMENTS

| | | | | |
|---|---|---|---|---|
| 12,322,342 B2 * | 6/2025 | Zhang | ................. | G09G 3/3258 |
| 12,364,109 B2 * | 7/2025 | Kim | ................. | H10K 59/80521 |

(Continued)

FOREIGN PATENT DOCUMENTS

| | | |
|---|---|---|
| EP | 3832731 A1 | 6/2021 |
| KR | 10-2017-0078168 A | 7/2017 |
| KR | 10-2019-0046358 A | 5/2019 |

OTHER PUBLICATIONS

European Patent Office, Extended European Search Report and Opinion, EP Patent Application No. 22196996.7, Apr. 21, 2023, eight pages.

(Continued)

*Primary Examiner* — Steven B Gauthier
*Assistant Examiner* — E. Rhett Cheek
(74) *Attorney, Agent, or Firm* — Fenwick & West LLP

(57) ABSTRACT

An electroluminescence display is disclosed that comprises: a pixel; a low-resistance line at one side of the pixel and having a connection part; an insulating layer on the low-resistance line; a low-resistance connecting terminal on the insulating layer and connected to the connection part; a passivation layer on the low-resistance connecting terminal; a planarization layer on the passivation layer; a cathode contact hole exposing a portion of the low-resistance connecting terminal. The low-resistance line includes an open area overlapping with a middle portion of the low-resistance connecting terminal at the connection part. The low-resistance connecting terminal connects to a first side and a second side of the low-resistance connecting terminal. The cathode electrode is connected to the low-resistance connecting terminal via the cathode contact hole.

18 Claims, 10 Drawing Sheets

(56) References Cited

U.S. PATENT DOCUMENTS

| | | | | |
|---|---|---|---|---|
| 12,396,348 B2 * | 8/2025 | Liu | .................. | H10K 59/80515 |
| 12,501,803 B2 * | 12/2025 | Park | .................. | H10K 59/1315 |
| 2016/0247873 A1 | 8/2016 | Zhang et al. | | |
| 2016/0293888 A1 | 10/2016 | Shim et al. | | |
| 2018/0123078 A1 * | 5/2018 | Byun | ................ | H10D 30/6723 |
| 2019/0172898 A1 | 6/2019 | Choi | | |
| 2019/0198799 A1 | 6/2019 | Lee et al. | | |
| 2020/0066817 A1 | 2/2020 | Kim | | |
| 2020/0212131 A1 * | 7/2020 | Kim | .................. | H10K 59/1315 |
| 2020/0343315 A1 * | 10/2020 | Lin | ..................... | H10K 59/126 |
| 2020/0365680 A1 | 11/2020 | Nakamura | | |
| 2021/0359078 A1 * | 11/2021 | Kim | .................. | H10K 59/1315 |
| 2023/0011322 A1 * | 1/2023 | Park | ..................... | H10K 50/824 |
| 2024/0090270 A1 * | 3/2024 | Wang | ................ | H10K 59/1201 |

OTHER PUBLICATIONS

China National Intellectual Property Administration, Office Action, Chinese Patent Application No. 202211590219.2, Dec. 16, 2025, 20 pages.

\* cited by examiner

1

ELECTROLUMINESCENCE DISPLAY

CROSS-REFERENCE TO RELATED APPLICATIONS

This application claims the benefit of Republic of Korea Patent Application No. 10-2021-0183984 filed on Dec. 21, 2021, which is hereby incorporated by reference in its entirety.

BACKGROUND

Field of Technology

The present disclosure relates to an electroluminescence display. Especially, the present disclosure relates to an electroluminescence display having an improved image quality stability by eliminating or blocking the lateral leakage current between neighboring pixels. In addition, the present disclosure relates to an electroluminescence display having an improved image quality stability by reducing the resistance of the cathode electrode adopting an auxiliary cathode line.

Discussion of the Related Art

Recently, various type of display such as the cathode ray tubes (CRTs), the liquid crystal displays (LCDs), the plasma display panels (PDPs) and the electroluminescent displays have been developed. These various types of display are used to display image data of various products such as computer, mobile phones, bank deposit and withdrawal devices (ATMs), and vehicle navigation systems according to their unique characteristics and purposes.

In particular, the organic light emitting diode display, which is a self-luminous display, has excellent optical performance such as wide viewing angle and high color reproducibility, and its application field is gradually widened, so it is in the spotlight for a high quality image display device. Due to these advantages, it is attracting attention as the most suitable display device for implementing 8K ultra-high resolution displays beyond 4K. As the resolution increases, the size of the emission area occupied in the pixel also becomes smaller. In order to maximize the size of the emission area, a top emission type structure is applied.

In the top emission type that is advantageous for the ultra-high resolution, a transparent conductive material is used for the cathode electrode. Since the transparent conductive material has a greater sheet resistance than the metal material, it may be difficult to maintain a constant cathode voltage when implementing a large-area display device. Accordingly, in a large area electroluminescent display having a top emission type, a structure for connecting to a signal line having a low-resistance may be required in order to reduce the sheet resistance of the cathode electrode.

As implementing the ultra-high-resolution structure, the size of the element for connecting to the low-resistance line also becomes smaller. As a result, the connectivity between the element and the low-resistance line may not be normally implemented. When such a connection defect occurs, there is a need for a structure capable of repairing the low-resistance line so that the connectivity with the low-resistance line may be normally achieved.

SUMMARY

The purpose of the present disclosure, as for solving the problems described above, is to provide an electroluminescence display having a large-area ultra-high resolution and excellent image quality. Another purpose of the present disclosure is to provide an electroluminescence display in which a cathode voltage may be maintained constant in a top emission type display suitable for implementing the ultra-high-resolution structure. Still another purpose of the present disclosure is to provide an electroluminescence display having a structure in which the connection defect is repaired when a cathode electrode and a low-resistance line are connected in an ultra-high-resolution density.

In order to accomplish the above mentioned purposes of the present disclosure, an electroluminescence display according to the present disclosure comprises: a pixel on a substrate, the pixel including an anode electrode, an emission layer and a cathode electrode; a low-resistance line at one side of the pixel, the low-resistance line having a connection part; an insulating layer on the low-resistance line; a low-resistance connecting terminal on the insulating layer, the low-resistance connecting terminal connected to the connection part of the low-resistance line; a passivation layer on the low-resistance connecting terminal; a planarization layer on the passivation layer; a cathode contact hole exposing a portion of the low-resistance connecting terminal; and wherein the low-resistance line includes an open area between a first side of the low-resistance line and a second side of the low-resistance line, the open area overlapping with a middle portion of the low-resistance connecting terminal at the connection part, wherein the low-resistance connecting terminal is connected to the first side and the second side of the low-resistance line, and wherein the cathode electrode is connected to the portion of the low-resistance connecting terminal that is exposed via the cathode contact hole.

In one embodiment, an electroluminescence display comprises: a low-resistance line on a substrate; a low-resistance connecting terminal connected to the low-resistance line; a pixel including an anode electrode, an emission layer, and a cathode electrode, the anode electrode non-overlapping with the low-resistance line; a passivation layer on the low-resistance connecting terminal; a planarization layer on the passivation layer; and a contact hole through a portion of the passivation layer and a portion of the planarization layer that overlaps the low-resistance connecting terminal, wherein a portion of the emission layer is disposed in the contact hole such that the portion of the emission layer is between a first portion of the low-resistance connecting terminal and a portion of the cathode electrode that is disposed in the contact hole, and a second portion of the low-resistance connecting terminal penetrates through the portion of the emission layer and is connected to the portion of the cathode that is disposed in the contact hole.

The electroluminescent display according to the present disclosure provides a top emission type electroluminescence display capable of maximizing an aperture ratio of an emission region to a pixel area in order to implement the ultra-high resolution. In particular, as implementing a large area electroluminescence display having a long diagonal length, the present disclosure provides a top emission type electroluminescence display having a structure for connecting a low-resistance line to a cathode electrode so as to maintain the sheet electrical resistance of a cathode electrode constant over an entire surface area. The present disclosure may provide the excellent and stable image quality by maintaining a constant cathode voltage in a large-area electroluminescence display. Even though a connection defect occurs because that the distance between pixels becomes narrower and the connection area between the low-resistance line and the cathode electrode becomes smaller as ultra-high-resolution is implemented, the top emission type electroluminescence display according to the present disclosure may have a repair structure capable of restoring the connection defect. Accordingly, the electroluminescence display according to the present disclosure may provide uniform image quality in an ultra-high-resolution and large-area electroluminescence display.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain the principle of the disclosure. In the drawings.

DETAILED DESCRIPTION

Figure 1:
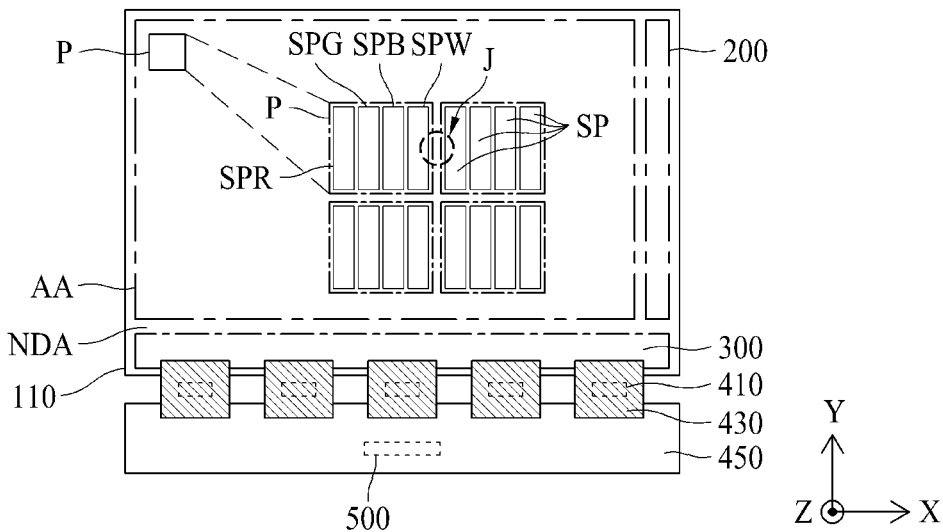
FIG. 1 is a plane view illustrating a schematic structure of an electroluminescence display according to one embodiment of the present disclosure.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these example embodiments are provided so that this disclosure may be sufficiently thorough and complete to assist those skilled in the art to fully understand the scope of the present disclosure. Further, the protected scope of the present disclosure is defined by claims and their equivalents.

The shapes, sizes, ratios, angles, numbers, and the like, which are illustrated in the drawings in order to describe various example embodiments of the present disclosure, are merely given by way of example. Therefore, the present disclosure is not limited to the illustrated details. Like reference numerals refer to like elements throughout the specification unless otherwise specified. In the following description, where the detailed description of the relevant known function or configuration may unnecessarily obscure an important point of the present disclosure, a detailed description of such known function of configuration may be omitted.

Reference will now be made in detail to the exemplary embodiments of the present disclosure, examples of which are illustrated in the accompanying drawings. Wherever possible, the same reference numbers will be used throughout the drawings to refer to the same or like parts. In the specification, it should be noted that like reference numerals already used to denote like elements in other drawings are used for elements wherever possible. In the following description, when a function and a configuration known to those skilled in the art are irrelevant to the essential configuration of the present disclosure, their detailed descriptions will be omitted. The terms described in the specification should be understood as follows.

In the present specification, where the terms "comprise," "have," "include," and the like are used, one or more other elements may be added unless the term, such as "only," is used. An element described in the singular form is intended to include a plurality of elements, and vice versa, unless the context clearly indicates otherwise.

In construing an element, the element is construed as including an error or tolerance range even where no explicit description of such an error or tolerance range is provided.

In the description of the various embodiments of the present disclosure, where positional relationships are described, for example, where the positional relationship between two parts is described using "on," "over," "under," "above," "below," "beside," "next," or the like, one or more other parts may be located between the two parts unless a more limiting term, such as "immediate(ly)," "direct(ly)," or "close(ly)" is used. For example, where an element or layer is disposed "on" another element or layer, a third layer or element may be interposed therebetween. Also, if a first element is described as positioned "on" a second element, it does not necessarily mean that the first element is positioned above the second element in the figure. The upper part and the lower part of an object concerned may be changed depending on the orientation of the object. Consequently, where a first element is described as positioned "on" a second element, the first element may be positioned "below" the second element or "above" the second element in the figure or in an actual configuration, depending on the orientation of the object.

In describing a temporal relationship, when the temporal order is described as, for example, "after," "subsequent," "next," or "before," a case which is not continuous may be included unless a more limiting term, such as "just," "imme-diate(ly)," or "direct(ly)," is used.

It will be understood that, although the terms "first," "second," and the like may be used herein to describe various elements, these elements should not be limited by these terms as they are not used to define a particular order. These terms are used only to distinguish one element from another. For example, a first element could be termed a second element, and, similarly, a second element could be termed a first element, without departing from the scope of the present disclosure.

In describing various elements in the present disclosure, terms such as first, second, A, B, (a), and (b) may be used. These terms are used merely to distinguish one element from another, and not to define a particular nature, order, sequence, or number of the elements. Where an element is described as being "linked", "coupled," or "connected" to another element, that element may be directly or indirectly connected to that other element unless otherwise specified. It is to be understood that additional element or elements may be "interposed" between the two elements that are described as "linked," "connected," or "coupled" to each other.

It should be understood that the term "at least one" should be understood as including any and all combinations of one or more of the associated listed items. For example, the meaning of "at least one of a first element, a second element, and a third element" encompasses the combination of all three listed elements, combinations of any two of the three elements, as well as each individual element, the first element, the second element, and the third element.

Features of various embodiments of the present disclosure may be partially or overall coupled to or combined with each other, and may be variously inter-operated with each other and driven technically as those skilled in the art can suffi-ciently understand. The embodiments of the present disclo-sure may be carried out independently from each other, or may be carried out together in a co-dependent relationship.

Hereinafter, an example of a display apparatus according to the present disclosure will be described in detail with reference to the attached drawings. Wherever possible, the same reference numbers will be used throughout the draw-ings to refer to the same or like parts. Since a scale of each of elements shown in the accompanying drawings may be different from an actual scale for convenience of description, the present disclosure is not limited to the scale shown in the drawings.

Hereinafter, referring to the attached figures, the present disclosure will be explained. FIG. 1 is a plane view illus-trating a schematic structure of an electroluminescence display according to one embodiment of the present disclo-sure. In FIG. 1, X-axis refers to the direction parallel to the scan line, Y-axis refers to the direction of the data line, and Z-axis refers to the height direction of the display device according to one embodiment.

Referring to FIG. 1, the electroluminescence display comprises a substrate 110, a gate (or scan) driver 200, a data pad portion 300, a source driving IC (integrated circuit) 410, a flexible film 430, a circuit board 450, and a timing controller 500.

The substrate 110 may include an electrical insulating material or a flexible material. The substrate 110 may be made of a glass, a metal or a plastic, but it is not limited thereto. When the electroluminescence display is a flexible display, the substrate 110 may be made of the flexible material such as plastic. For example, the substrate 110 may include a transparent polyimide material.

The substrate 110 may include a display area AA and a non-display area NDA. The display area AA, which is an area for representing the video images, may be defined as the majority middle area of the substrate 110, but it is not limited thereto. In the display area AA, a plurality of scan lines (or gate lines), a plurality of data lines and a plurality of pixels P may be formed or disposed. Each of pixels may include a plurality of sub pixels SP. Each of sub pixels includes the scan line and the data line, respectively. For example, one of pixel P may include three sub pixels SP or four sub pixels SP.

The non-display area NDA, which is an area not repre-senting the video images, may be defined at the circumfer-ence areas of the substrate 110 surrounding all or some of the display area AA. In the non-display area NDA, the gate driver 200 and the data pad portion 300 may be formed or disposed.

The gate driver 200 may supply the scan (or gate) signals to the scan lines according to the gate control signal received from the timing controller 500. The gate driver 200 may be formed at the non-display area NDA at any one outside of the display area AA on the substrate 110, as a GIP (gate driver in panel) type. GIP type means that the gate driver 200 is directly formed on the substrate 110.

The data pad portion 300 may supply the data signals to the data line according to the data control signal received from the timing controller 500. The data pad portion 300 may be made as a driver chip and mounted on the flexible film 430. Further, the flexible film 430 may be attached at the non-display area NDA at any one outside of the display area AA on the substrate 110, as a TAB (tape automated bonding) type.

The source driving IC 410 may receive the digital video data and the source control signal from the timing controller 500. The source driving IC 410 may convert the digital video data into the analog data voltages according to the source control signal and then supply that to the data lines. When the source driving IC 410 is made as a chip type, it may be installed on the flexible film 430 as a COF (chip on film) or COP (chip on plastic) type.

The flexible film 430 may include a plurality of first link lines connecting the data pad portion 300 to the source driving IC 410, and a plurality of second link lines connect-ing the data pad portion 300 to the circuit board 450. The flexible film 430 may be attached on the data pad portion 300 using an anisotropic conducting film, so that the data pad portion 300 may be connected to the first link lines of the flexible film 430.

The circuit board 450 may be attached to the flexible film 430. The circuit board 450 may include a plurality of circuits implemented as the driving chips. For example, the circuit board 450 may be a printed circuit board or a flexible printed circuit board.

The timing controller 500 may receive the digital video data and the timing signal from an external system board through the line cables of the circuit board 450. The timing controller 500 may generate a gate control signal for con-trolling the operation timing of the gate driver 200 and a source control signal for controlling the source driving IC 410, based on the timing signal. The timing controller 500 may supply the gate control signal to the gate driver 200 and supply the source control signal to the source driving IC 410. Depending on the product types, the timing controller 500 may be formed as one chip with the source driving IC 410 and mounted on the substrate 110.

Referring to the planar structure of the pixel P array as shown in FIG. 1, the electroluminescence display according to the present disclosure may have a plurality of pixels P arrayed in a matrix manner Each of pixels P may include a plurality of sub-pixels SP (e.g., four sub-pixels). For example, one of pixel P may include a red sub-pixel SPR, a green sub-pixel SPG, a blue sub-pixel SPB and a white sub-pixel SPW. However, it is not limited thereto, one of pixel P may include three sub-pixels SP or five sub-pixels SP. The sub-pixels SP may be arrayed with a predetermined distance (or gap) from each other. Further, the pixels P may be arrayed with a predetermined distance (or gap) from each other. FIG. 1 shows an exemplary array in which the pixel gap between the pixels P may be wider than the sub-pixel gap between the sub-pixels SP. For another example, all sub-pixels SP may be arrayed with the sub-pixel gap without distinction between the pixel gap and the sub-pixel gap.

Figure 2:
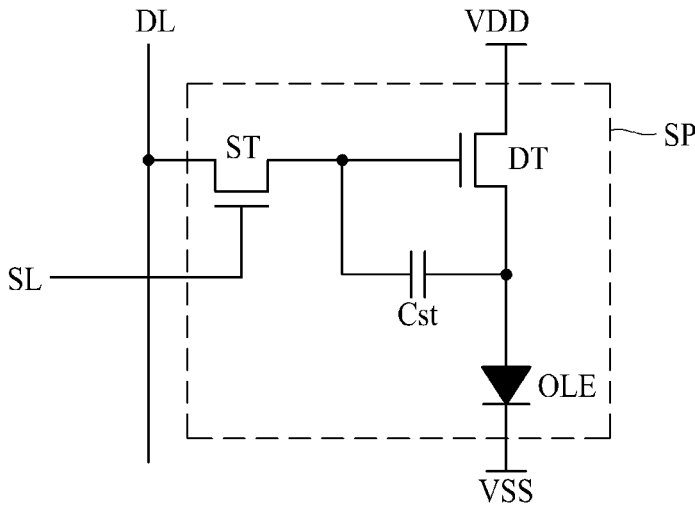
FIG. 2 is a circuit diagram illustrating a structure of one pixel included in the electroluminescence display according to one embodiment of the present disclosure.
Figure 3:
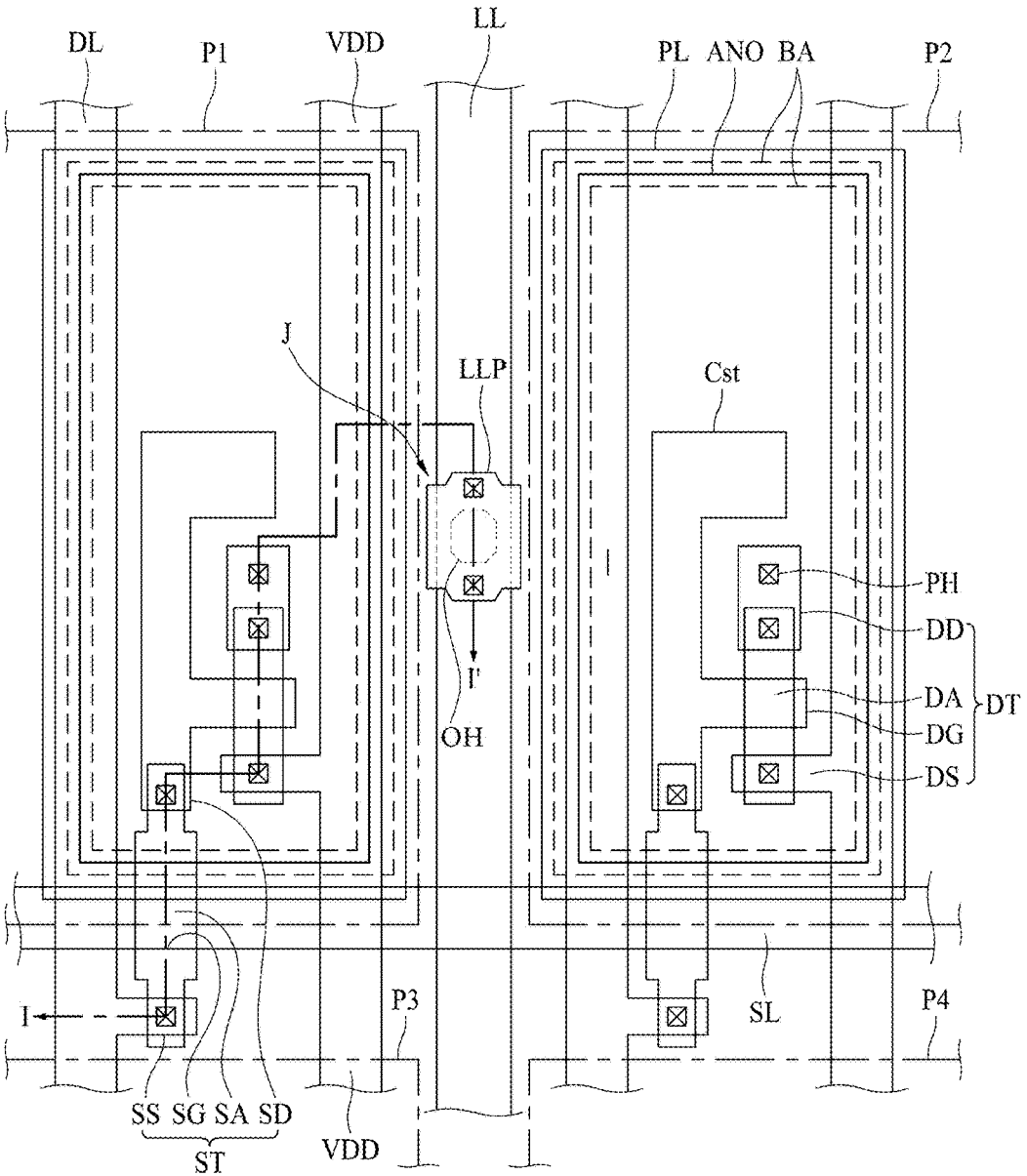
FIG. 3 is an enlarged plan view illustrating a structure between two neighboring pixels arrayed as shown in FIG. 1 according to one embodiment of the present disclosure.
Figure 4:
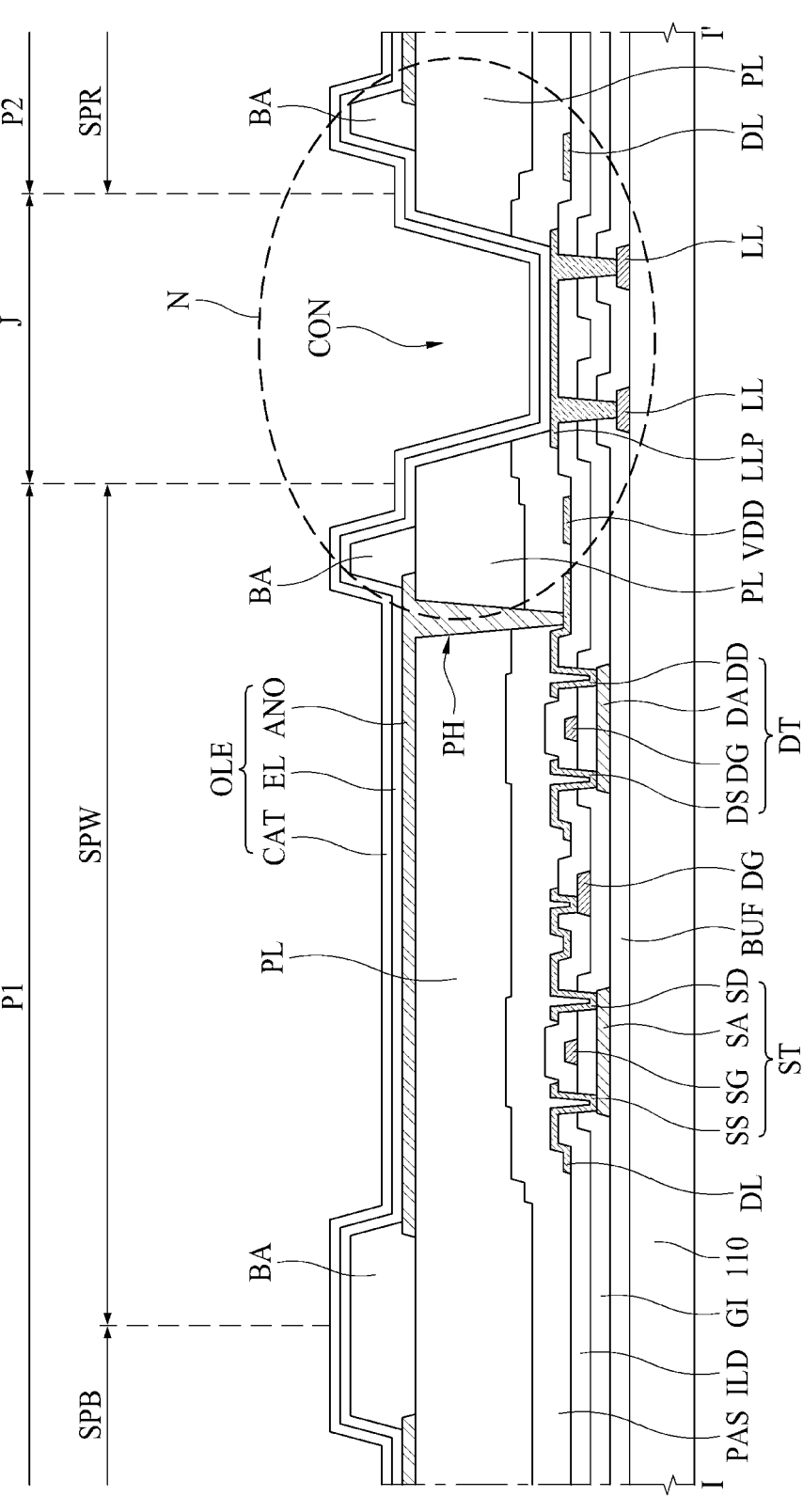
FIG. 4 is a cross-sectional view along to cutting line I-I' in FIG. 3, for illustrating the electroluminescence display according to a first embodiment of the present disclosure.

FIG. 2 is a circuit diagram illustrating a structure of one sub-pixel included in the electroluminescence display according to one embodiment of the present disclosure. FIG. 3 is an enlarged plan view illustrating a structure between two neighboring pixels arrayed as shown in FIG. 1 according to one embodiment of the present disclosure. FIG. 4 is a cross-sectional view along to cutting line I-I' in FIG. 3, for illustrating the electroluminescence display according to one embodiment of the present disclosure.

Referring to FIGS. 2 to 3, one sub-pixel SP of the light emitting display may be defined by a scan line SL, a data line DL and a driving current line VDD. One sub-pixel SP of the light emitting display may include a switching thin film transistor ST, a driving thin film transistor DT, a light emitting diode OLE, and a storage capacitance Cst. The driving current line VDD may be supplied with a high-level voltage for driving the light emitting diode OLE.

A switching thin film transistor ST and a driving thin film transistor DT may be formed on a substrate SUB. For example, the switching thin film transistor ST may be disposed at the portion where the scan line SL and the data line DL is crossing. The switching thin film transistor ST may include a switching gate electrode SG, a switching source electrode SS and a switching drain electrode SD. The switching gate electrode SG may be connected to the scan line SL. The switching source electrode SS may be connected to the data line DL and the switching drain electrode SD may be connected to the driving thin film transistor DT. By supplying the data signal to the driving thin film transistor DT, the switching thin film transistor ST may play a role of selecting a pixel which would be driven.

The driving thin film transistor DT may play a role of driving the light diode OLE of the selected pixel by the switching thin film transistor ST. The driving thin film transistor DT may include a driving gate electrode DG, a driving source electrode DS, and a driving drain electrode DD. The driving gate electrode DG may be connected to the switching drain electrode SD of the switching thin film transistor ST. For example, the driving gate electrode DG may be connected to the switching drain electrode SD via the drain contact hole DH penetrating the gate insulating layer GI. The driving source electrode DS may be connected to the driving current line VDD, and the driving drain electrode DD may be connected to an anode electrode ANO of the light emitting diode OLE. A storage capacitance Cst may be disposed between the driving gate electrode DG of the driving thin film transistor DT and the anode electrode ANO of the light emitting diode OLE.

The driving thin film transistor DT may be disposed between the driving current line VDD and the light emitting diode OLE. The driving thin film transistor DT may control the amount of electric current flowing to the light emitting diode OLE from the driving current line VDD according to the voltage level of the driving gate electrode DG connected to the switching drain electrode SD of the switching thin film transistor ST.

The light emitting diode OLE may include an anode electrode ANO, a light emitting layer EL and a cathode electrode CAT. The light emitting diode OLE may emit the light according to the amount of the electric current controlled by the driving thin film transistor DT. In other words, the light emitting diode OLE may be driven by the voltage differences between the low-level voltage and the high-level voltage controlled by the driving thin film transistor DT. The anode electrode ANO of the light emitting diode OLE may be connected to the driving drain electrode DD of the driving thin film transistor DT, and the cathode electrode CAT may be connected to a low-level voltage line Vss where a low-level potential voltage is supplied. That is, the light emitting diode OLE may be driven by the high-level voltage controlled by the driving thin film transistor DT and the low-level voltage supplied from the low-level voltage line Vss.

Referring to FIGS. 3 and 4, the cross-sectional structure of the display according to one embodiment of the present disclosure will be described. A low-resistance line LL may be disposed on a substrate 110. The low-resistance line LL may be disposed in parallel with the data line DL between neighboring two pixels P1 and P2. In some cases, one low-resistance line LL may be disposed in every two or three pixel-columns A connection part J may be defined at a portion of the low-resistance line LL that connects to the cathode electrode CAT in one embodiment. The detailed structure of the connection part J will be described later. The low-resistance line LL may be connected to the low-power line VSS. In some cases, the low-resistance line LL may be configured as the low-power line VSS. Further, even though it is not shown in figures, a light shielding layer formed on the same layer as the low-resistance line LL but separated from the low-resistance line LL and disposed under the semiconductor layers SA and DA may be further included. A buffer layer BUF may be deposited on the low-resistance line LL.

The semiconductor layers SA and DA may be formed on the buffer layer BUF. The semiconductor layer includes a switching semiconductor layer SA of the switching thin film transistor ST and a driving semiconductor layer DA of the driving thin film transistor DT. A gate insulating layer GI may be stacked on the semiconductor layers SA and DA as covering whole surface of the substrate 110.

Gate electrodes SG and DG overlapped with the scan line SL and the semiconductor layers SA and DA may be formed on the gate insulating layer GI. The gate electrode includes a switching gate electrode SG of the switching thin film transistor ST and a driving gate electrode DG of the driving thin film transistor DT. An intermediate insulating layer ILD may be stacked on the scan line SL and the gate electrodes SG and DG as covering whole surface of the substrate 110.

Source electrodes SS and DS, drain electrodes SD and DD, a low-resistance connecting terminal LLP, a data line DL and a driving current line VDD may be disposed on the intermediate insulating layer ILD. The source electrode includes a switching source electrode SS of the switching thin film transistor ST and a driving source electrode DS of the driving thin film transistor DT. The drain electrode includes a switching drain electrode SD of the switching thin film transistor ST and a driving drain electrode DD of the driving thin film transistor DT. Each source electrodes SS and DS may be respectively connected to one side (e.g., a first side) of semiconductor layers SA and DA via a contact hole penetrating the intermediate insulating layer ILD and the gate insulating layer GI. Each drain electrodes SD and DD may be respectively connected to another side (e.g., a second side) of semiconductor layers SA and DA via a contact hole penetrating the intermediate insulating layer ILD and the gate insulating layer GI.

The switching source electrode SS may be branched from the data line DL. The switching drain electrode SD may be connected to the driving gate electrode DG of the driving thin film transistor DT. The driving source electrode DS may be branched from the driving current line VDD. The low-resistance connecting terminal LLP may be overlapped with the low-resistance line LL at the connection part J defined on the low-resistance line LL. The low-resistance connecting terminal LLP may be connected to the low-resistance line LL via a contact hole. The low-resistance connecting terminal LLP may be connected to the cathode electrode CAT of the light emitting diode OLE. The connection structure between the low-resistance connecting terminal LLP and the cathode electrode CAT is described below.

A passivation layer PAS may be deposited on the surface of the substrate 110 having the thin film transistors ST and DT and the low-resistance connecting terminal LLP. The passivation layer PAS may be made of inorganic material such as silicon oxide or silicon nitride. A planarization layer PL may be deposited on the passivation layer PAS. The planarization layer PL may be a layer for flattening the surface of the substrate 110 on which the thin film transistors ST and DT are formed, which may not be a uniform (or even) surface. In order to make the height difference uniform, the planarization layer PL may be formed of an organic material. A pixel contact hole PH may be formed at the passivation layer PAS and the planarization layer PL for exposing some portion of the driving drain electrode DD of the driving thin film transistor DT.

An anode electrode ANO is formed on the top surface of the planarization layer PL. The anode electrode ANO may be connected to the driving drain electrode DD of the driving thin film transistor DT via the pixel contact hole PH. The anode electrode ANO may have different structure according to the emission type of the light emitting diode OLE. For an example of the bottom emission type in which the light emits to the direction where the substate 110 is disposed, the anode electrode ANO may be formed of a transparent conductive material. For example, for the bottom emission type, the anode electrode ANO may be made of an oxide conductive material such as indium-tin-oxide (or ITO) or indium-zinc-oxide (or IZO). For another example of the top emission type in which the light emits to the direction opposite the substrate 110, the anode electrode ANO may be made of metal material having excellent light transmittance. Here, the explanation may be described focused on the top emission type.

A bank BA may be formed on the anode electrode ANO. The bank BA may cover the circumference areas of the anode electrode ANO and may expose most of middle areas of the anode electrode ANO. The middle areas of the anode electrode ANO exposed by the bank BA may be defined the emission area.

An emission layer EL is deposited on the anode electrode ANO. The emission layer EL may be deposited on the anode electrode ANO and the bank BA as covering whole surface of the display area AA of the substrate 110. For an example, the emission layer EL may include two or more stacked emission portions for emitting white light. In detail, the emission layer EL may include a first emission layer providing first color light and a second emission layer providing second color light, for emitting the white light by combining the first color light and the second color light.

For another example, the emission layer EL may include any one of the blue emission layer, the green emission layer and the red emission layer for providing the light color corresponding to the color allocated at the pixel. In addition, the light emitting diode OLE may further include functional layers for enhancing the light emitting efficiency and/or life-time of the emission layer EL.

The cathode electrode CAT may be disposed on the emission layer EL. The cathode electrode CAT may be stacked on the emission layer EL as being surface contact each other. The cathode electrode CAT may be formed as one sheet element over the whole area of the substrate 110 as being commonly connected whole emission layers EL disposed at all pixels. In the case of the bottom emission type, the cathode electrode CAT may include metal material having excellent light reflection ratio. For example, the cathode electrode CAT may include at least any one of silver (Ag), aluminum (Al), molybdenum (Mo), gold (Au), magnesium (Mg), calcium (Ca) or barium (B a). For the case of top emission type, the cathode electrode CAT may be made of a transparent conductive material. For example, the cathode electrode CAT may be made of metallic oxide material include indium-tin-oxide or indium-zinc-oxide. Hereinafter, the explanation may be described focused on the top emission type.

In addition, the electroluminescence display according to the present disclosure may include a cathode contact hole CON for connecting the cathode electrode CAT to the low-resistance connecting terminal LLP. The cathode contact hole CON may disposed at the connection part J. Therefore, a plurality of the cathode contact holes CON may be disposed at regular (e.g., predetermined) intervals along the low-resistance line LL. The cathode contact hole CON may be formed by penetrating the passivation layer PAS and the planarization layer PL covering the low-resistance connecting terminal LLP. Hereinafter, some embodiments according to various structures of the cathode contact hole will be described.

First Embodiment

Figure 5:
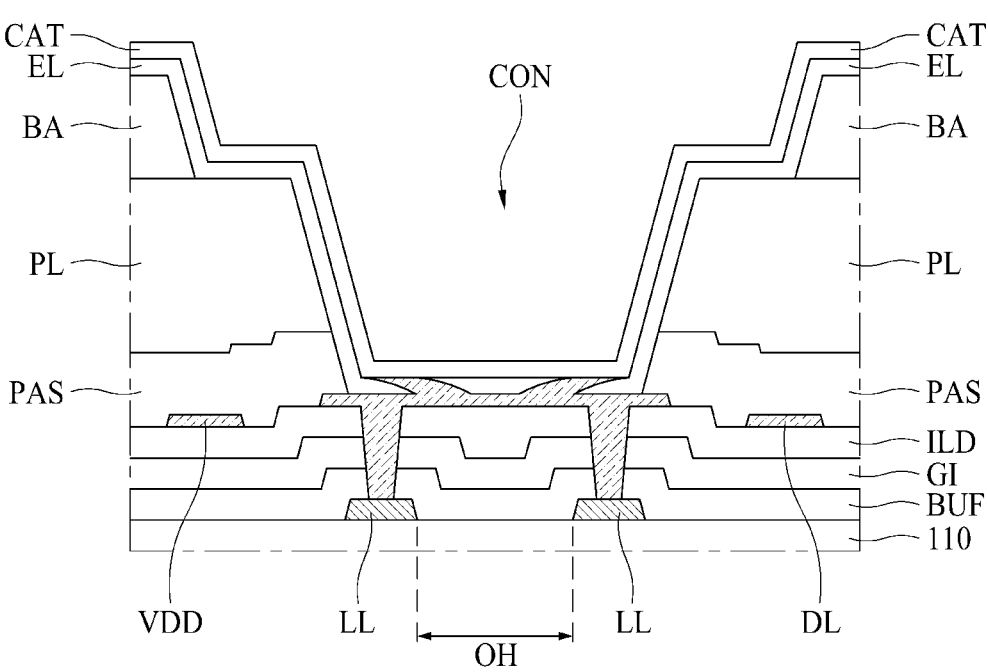
FIG. 5 is an enlarged cross-sectional view of the circular part 'N' in FIG. 4 illustrating a structure of connection part in the electroluminescence display according to the first embodiment of the present disclosure.

Referring to FIGS. 4 and 5, the first embodiment of the present disclosure will be described. FIG. 5 is an enlarged cross-sectional view of the circular part 'N' in FIG. 4 illustrating a structure of connection part in the electroluminescence display according to the first embodiment of the present disclosure.

Referring to the cross-sectional structure of the connection part J, the low-resistance line LL is disposed on the substrate 110. The low-resistance line LL may have an open area OH formed at the connection part J. The open area OH may be an open hole for directly irradiating the laser light to the low-resistance connecting terminal LLP disposed thereon. The open area OH may have various shapes and structures. The detailed explanations will be described later.

The buffer layer BUF may be formed on the low-resistance line LL. The gate insulating layer GI is deposited on the buffer layer BUF, and the intermediate insulating layer ILD is deposited on the gate insulating layer GI. The stacked layer structed of the buffer layer BUF, the gate insulating layer GI and the intermediate insulating layer ILD may be referred to as an insulating layer.

On the insulating layer i.e., on the intermediate insulating layer ILD, the low-resistance connecting terminal LLP is formed. The low-resistance connecting terminal LLP may be made of the same material and disposed at the same layer with the source electrodes SS and DS and the drain electrodes SD and DD of the thin film transistors ST and DT. The low-resistance connecting terminal LLP may be connected to the low-resistance line LL via the contact hole formed at the insulating layer including the buffer layer BUF, the gate insulating layer GI and the intermediate insulating layer ILD.

The low-resistance connecting terminal LLP may have a polygonal shape or a circular shape corresponding to the size of the connection part J. In one embodiment, the low-resistance connecting terminal LLP may have an area size that is larger than the open area OH, and a shape for fully covering (e.g., overlapping) the open area OH. Accordingly, in the cross-sectional view, one end (e.g., a first end) of the low-resistance connecting terminal LLP may have a bridge shape in which the low-resistance connecting terminal LLP is connected to one side of the low-resistance line LL, and the other end (e.g., a second end) of the low-resistance connecting terminal LLP may be connected to the other side of the low-resistance line LL. The middle portion of the low-resistance connecting terminal LLP between the ends of the low-resistance connecting terminal LLP may be exposed by the open area OH of the low-resistance line LL as viewing at the direction where the substrate 110 is disposed.

The passivation layer PAS and the planarization layer PL are sequentially stacked on the low-resistance connecting terminal LLP. Particularly, the passivation layer PAS and the planarization layer PL may have a cathode contact hole CON for exposing the middle portion of the low-resistance connecting terminal LLP.

On the planarization layer PL, the anode electrode ANO is formed, and the bank BA is formed on the anode electrode ANO. The emission layer EL is deposited on the anode electrode ANO and the bank BA, and the cathode electrode CAT is deposited on the emission layer EL. Accordingly, at the cathode contact hole CON, the emission layer EL and the cathode electrode CAT are sequentially deposited on the exposed portion of the low-resistance connecting terminal LLP.

The connection part J may be a part for connecting the low-resistance connecting terminal LLP and cathode electrode CAT physically and electrically. At the cathode contact hole CON, the emission layer EL is interposed between the low-resistance connecting terminal LLP and the cathode electrode CAT, so they are not connected each other. In order to connect the low-resistance connecting terminal LLP and the cathode electrode CAT, a laser may be irradiated to the low-resistance connecting terminal LLP via the open area OH formed at the low-resistance line LL from the outside the substrate 110. As the result, the low-resistance connecting terminal LLP may be melted by the thermal energy of the laser, diffuses through the emission layer EL in an upward direction, and then the low-resistance connecting terminal LLP is connected to the cathode electrode CAT.

When irradiating the laser for connecting the low-resistance connecting terminal LLP and the cathode electrode CAT physically and electrically, the laser may be irradiated from outside the cathode electrode CAT. For the case of the top emission type, since the cathode electrode CAT is made of the transparent conductive material, the thermal energy of the laser may be transmitted to the low-resistance connecting terminal LLP through the cathode electrode CAT. Before reaching to the low-resistance connecting terminal LLP, the thermal energy may first be transferred to the emission layer EL. In this case, before the low-resistance connecting terminal LLP is melted, a large amount of thermal energy may be transferred to the emission layer EL, which may adversely affect the emission layer EL of adjacent pixels.

Therefore, in the top emission type electroluminescence display according to the present disclosure, in one embodiment the thermal energy is transferred to the low-resistance connecting terminal LLP, at first by irradiating the laser from the direction of the substrate 110. In addition, the top emission type electroluminescence display may include a repair element for connecting the defected pixel to the normal pixel. In this case, in one embodiment to irradiate a laser from the direction of the substrate 110, during the laser repair process. Accordingly, in the top emission type electroluminescence display according to the present disclosure, a laser process for connecting the low-resistance connecting terminal LLP and the cathode electrode CAT may be performed simultaneously with the repair process.

The electroluminescence display according to the first embodiment of the present disclosure may have the top emission type in which the cathode electrode CAT is formed of a transparent conductive material. The top emission type may maximize the size of the light emitting diode in the pixel area, and thus has an advantage of providing high luminance even with a small sized pixel. In addition, since the sheet resistance of the cathode electrode CAT may be reduced by the low-resistance line LL, the present disclosure may provide the excellent display quality even when a large-area electroluminescence display is implemented. In particular, since the laser is irradiated directly to the low-resistance connecting terminal LLP via the open area OH formed in the low resistance line LL, the low-resistance connecting terminal LLP and the cathode electrode CAT may be connected by using a laser in a wavelength band of 266 nm having relatively low energy. As shown in FIG. 5, as a result of applying the layer, a portion of the emission layer EL is disposed in the cathode contact hole CON such that the portion of the emission layer EL is between a first portion of the low-resistance connecting terminal LLP and a portion of the cathode electrode CAT that is disposed in the contact hole CON, and a second portion of the low-resistance connecting terminal LLP penetrates through the portion of the emission layer EL and is connected to the portion of the cathode CAT that is disposed in the contact hole CON.

Second Embodiment

Figure 6:
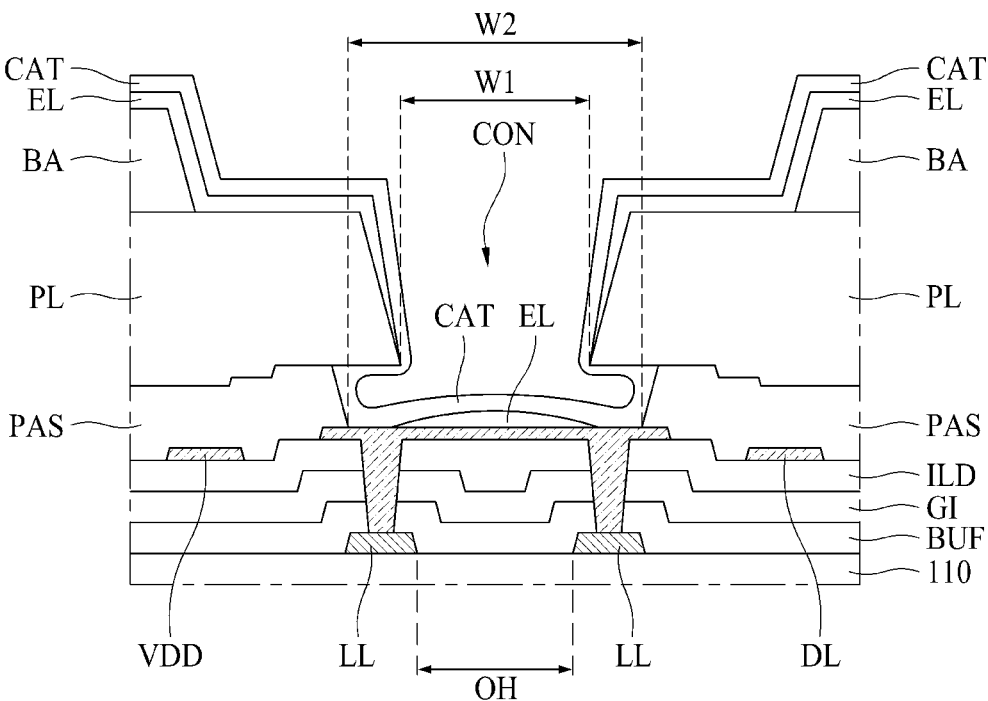
FIG. 6 is an enlarged cross-sectional view illustrating a structure of connection part in the electroluminescence display according to a second embodiment of the present disclosure.

In the first embodiment, by irradiating the laser at the low-resistance connecting terminal LLP exposed by the cathode contact hole CON disposed at all connection parts J defined in the electroluminescence display, the cathode electrode CAT may be connected to the low-resistance line LL. In the second embodiment, referring to FIG. 6, a structure of the cathode contact hole CON may be provided for connecting the cathode electrode CAT to the low-resistance connecting terminal LLP without irradiating the laser. FIG. 6 is an enlarged cross-sectional view illustrating a structure of connection part in the electroluminescence display according to a second embodiment of the present disclosure. Here, since the cross-sectional structure of other parts except for the connection part J is the same as that of FIG. 4, the entire cross-sectional view is not shown in FIG. 6.

Referring to the cross-sectional view of the connection part J, the low-resistance line LL is disposed on the substrate 110. The low-resistance line LL has an open area OH formed at the connection part J. The open area OH may be an open hole for directly irradiating the laser to the low-resistance connecting terminal LLP disposed on the low-resistance line LL.

The insulating layer is deposited on the low-resistance line LL. The insulating layer may include the buffer layer BUF, the gate insulating layer GI and the intermediate insulating layer ILD sequentially stacked on the substrate 110. The low-resistance connecting terminal LLP is disposed on the insulating layer. The low-resistance connecting terminal LLP may be connected to the low-resistance line LL via the contact hole formed at the insulating layer.

In one embodiment, the low-resistance connecting terminal LLP may have an area size that is larger than the open area OH, and a shape for fully covering (e.g., overlapping) the open area OH. Accordingly, in the cross-sectional view, one end (e.g., a first end) of the low-resistance connecting terminal LLP may have a bridge shape in which the low-resistance connecting terminal LLP is connected to one side of the low-resistance line LL, and the other end (e.g., a second end) of the low-resistance connecting terminal LLP may be connected to the other side of the low-resistance line LL. The middle portion of the low-resistance connecting terminal LLP between the ends of the low-resistance connecting terminal LLP may be exposed by the open area OH of the low-resistance line LL as viewing at the direction where the substrate 110 is disposed.

The passivation layer PAS and the planarization layer PL are sequentially stacked on the low-resistance connecting terminal LLP. Particularly, the passivation layer PAS and the planarization layer PL may have a cathode contact hole CON for exposing the middle portions of the low-resistance connecting terminal LLP.

In particular, the cathode contact hole CON may have a structure in which the passivation layer PAS may have an under-cut area UC formed by over-etching the passivation layer PAS than the planarization layer PL. For example, the cathode contact hole CON may have a second width W2 formed at the passivation layer PAS, and a first width W1 formed at the planarization layer PL where the first width W1 is narrower than the second width W2.

At the connection part J, the emission layer EL is deposited on the low-resistance connecting terminal LLP exposed by the cathode contact hole CON. However, due to the structure of the under-cut UC, the emission layer EL may be deposited on some portions of the low-resistance connecting terminal LLP which are the exposed portions by the second width W2 formed at the planarization layer PL, but may be not deposited on the under-cut area UC.

However, since the cathode electrode CAT is made of inorganic material, the cathode electrode CAT may be deposited on the emission layer EL and on the under-cut area UC. That is, the cathode electrode CAT may have a structure in which the cathode electrode CAT is directly connected to the low-resistance connecting terminal LLP at the cathode contact hole CON formed at the connection part J in the under-cut area UC.

Figure 7A:
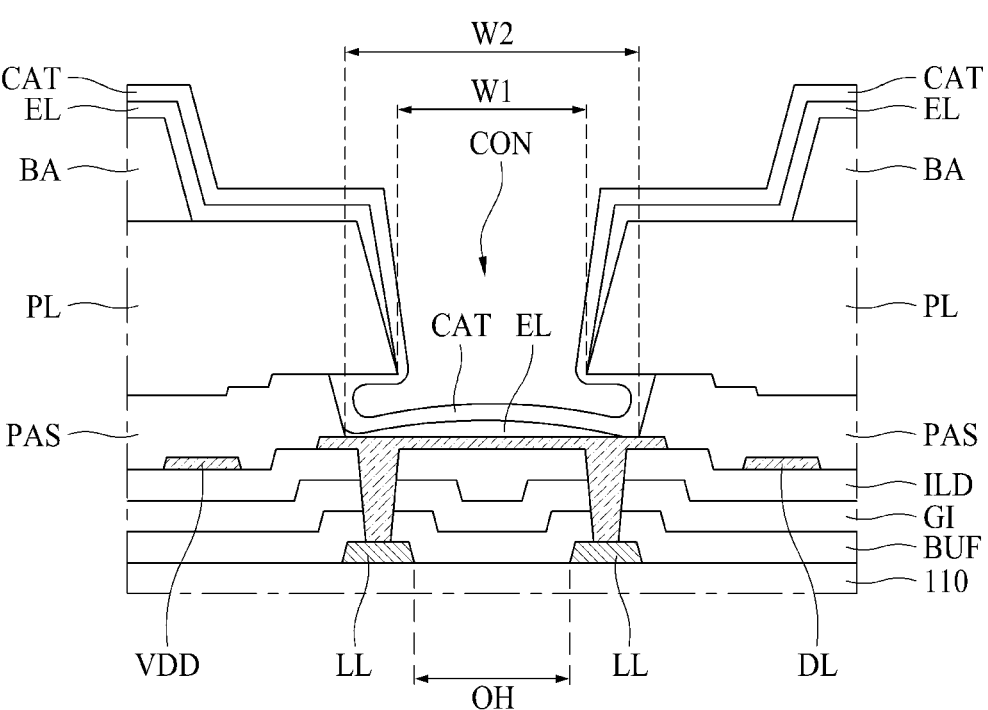
FIG. 7A is an enlarged cross-sectional view illustrating a case in which contact failure occurs at the connection part of the electroluminescence display according to the second embodiment of the present disclosure.

In the second embodiment, due to the under-cut area UC formed at the cathode contact hole CON, the cathode electrode CAT may be physically and electrically connected to the low-resistance connecting terminal LLP without conducting a laser process. However, with the ultra-high-resolution density structure, the size of pixel may become smaller and the interval between two neighboring pixels may also become narrower, so that the size of the cathode contact hole CON may become smaller. In this case, the under-cut area UC may also have a smaller size. Accordingly, as shown in FIG. 7A, the emission layer EL may be deposited on the under-cut area UC. FIG. 7A is an enlarged cross-sectional view illustrating a case in which contact failure occurs at the connection part of the electroluminescence display according to the second embodiment of the present disclosure.

Figure 7B:
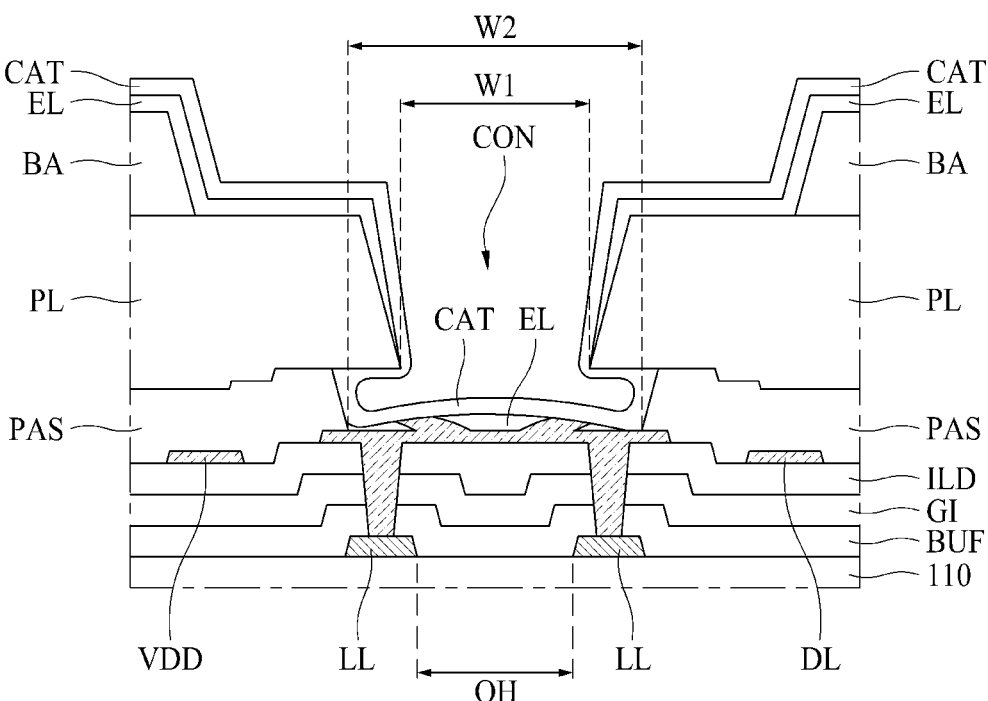
FIG. 7B is an enlarged cross-sectional view after recovering the contact failure at the connection part of the electroluminescence display according to the second embodiment of the present disclosure.

As the result, the cathode electrode CAT may not be connected to the low-resistance connecting terminal LLP. Even if the cathode electrode CAT is connected to the low-resistance connecting terminal LLP, the connected area may be very small, so there may be a contact failure. In order to prevent the contact failure, as shown in FIG. 7B, the laser process may further be conducted to connecting the cathode electrode CAT to the low-resistance connecting terminal LLP where the contact failure is occurred. FIG. 7B is an enlarged cross-sectional view after recovering the contact failure at the connection part of the electroluminescence display according to the second embodiment of the present disclosure.

In particular, in the top emission type electroluminescence display according to the present disclosure, in one embodiment, for connecting the low-resistance connecting terminal LLP and the cathode electrode CAT, the thermal energy is transferred to the low-resistance connecting terminal LLP, at first by irradiating the laser from the direction of the substrate 110. In addition, for the case that the repair element is further included in the top emission type electroluminescence display for detouring (or connecting) the defected pixel to the normal pixel, in one embodiment the laser is irradiated from the direction of the substrate 110 during the repair process. Accordingly, in the top emission type electroluminescence display according to the present disclosure, in one embodiment the laser process for connecting the low-resistance connecting terminal LLP to the cathode electrode CAT may be simultaneously conducted with the repair process.

In the second embodiment unlike in the first embodiment, the laser irradiation is not performed at all connection part J, but the laser irradiation is selectively performed at the connection part J where the connection failure is occurred. Irradiating the laser is to apply the thermal energy to a specific area, so an unwanted defect may occur due to the concentration of high thermal energy. Therefore, it is desirable to reduce the various processes using the laser as much as possible.

The electroluminescence display according to the second embodiment of the present disclosure may have a feature of top emission type in which the cathode electrode CAT is formed of the transparent conductive material. The top emission type may maximize the size of the light emitting diode in the pixel area, and thus has an advantage of providing high luminance even with a small sized pixel. Specifically, since the laser is directly irradiated to the low-resistance connecting terminal from the direction of the substrate, the connection failure may be recovered by using a low-energy laser. During the repair process performed in the video quality inspection process after the electroluminescence display is completely manufactured, the contact defect of the connection part may be also detected and repaired, so the overall manufacturing time may be reduced, and the damages caused by LASER irradiation may be reduced.

Third Embodiment

Figure 8:
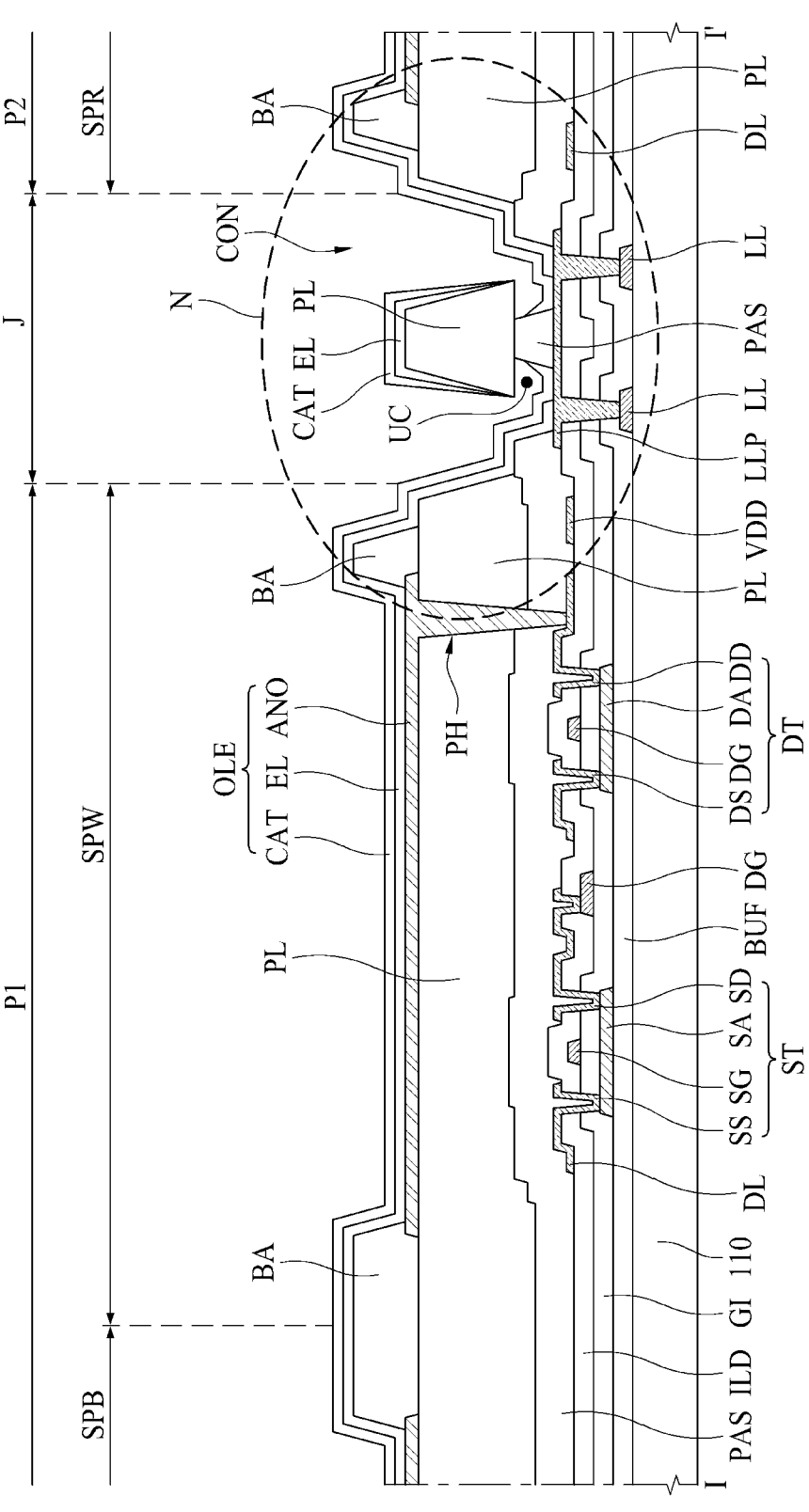
FIG. 8 is an enlarged cross-sectional view illustrating a structure of connection part in the electroluminescence display according to a third embodiment of the present disclosure.
Figure 9A:
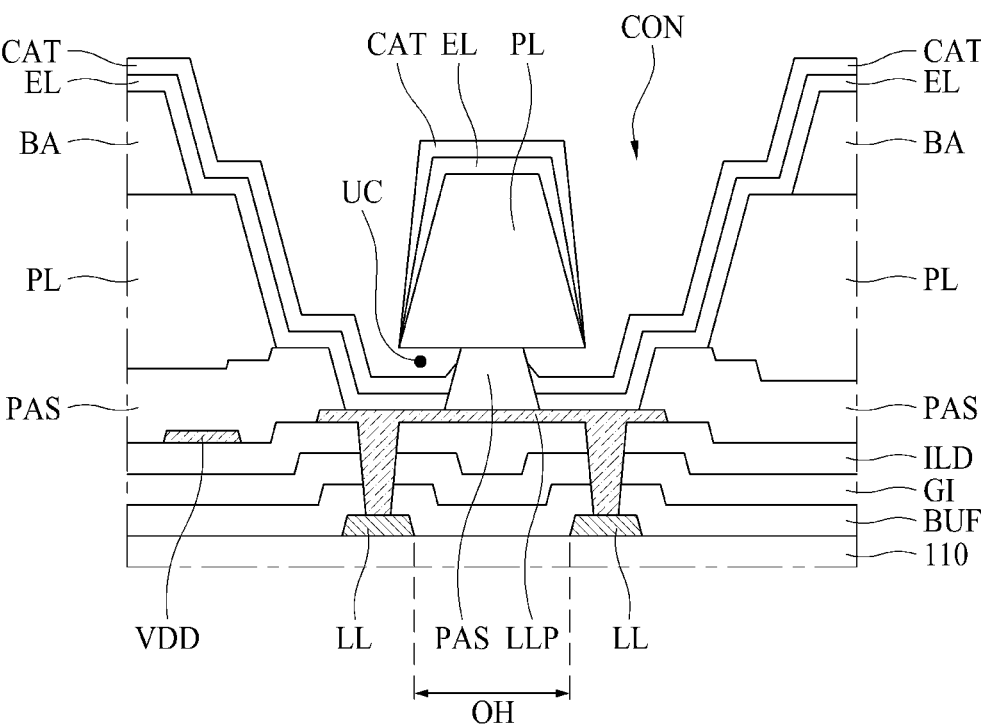
FIG. 9A is an enlarged cross-sectional view illustrating a case in which contact failure occurs at the connection part of the electroluminescence display according to the third embodiment of the present disclosure.
Figure 9B:
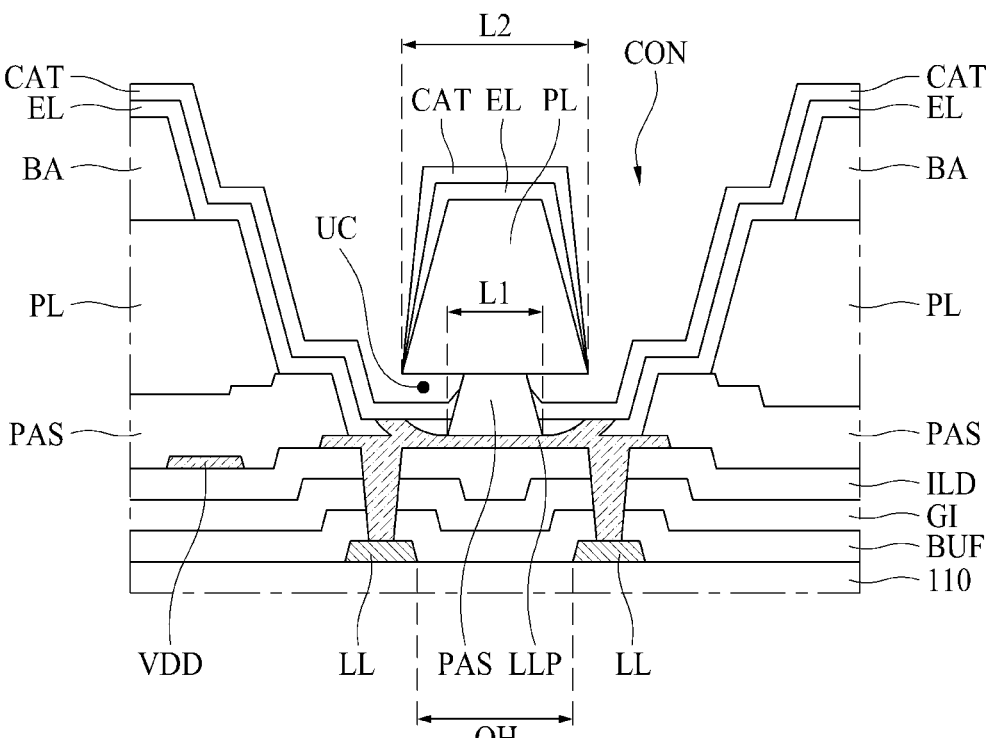
FIG. 9B is an enlarged cross-sectional view after recovering the contact failure at the connection part of the electroluminescence display according to the third embodiment of the present disclosure.

Hereinafter, referring to FIGS. 8, 9A and 9B, an electroluminescence display according to the third embodiment of the present disclosure will be described. FIG. 8 is an enlarged cross-sectional view illustrating a structure of connection part in the electroluminescence display according to the third embodiment of the present disclosure. FIG. 9A is an enlarged cross-sectional view illustrating a case in which contact failure occurs at the connection part of the electroluminescence display according to the third embodiment of the present disclosure. FIG. 9B is an enlarged cross-sectional view after recovering the contact failure at the connection part of the electroluminescence display according to the third embodiment of the present disclosure. Here, since the cross-sectional structure of other parts except for the connection part J is the same as that of FIG. 8, the entire cross-sectional view is not shown in FIGS. 9A and 9B.

Referring to the cross-sectional view of the connection part J, the low-resistance line LL is disposed on the substrate 110. The low-resistance line LL has an open area OH formed at the connection part J. The open area OH may be an open hole for directly irradiating the laser to the low-resistance connecting terminal LLP disposed on the low-resistance line LL.

The insulating layer is deposited on the low-resistance line LL. The insulating layer may include the buffer layer BUF, the gate insulating layer GI and the intermediate insulating layer ILD sequentially stacked on the substrate 110. The low-resistance connecting terminal LLP is disposed on the insulating layer. The low-resistance connecting terminal LLP may be connected to the low-resistance line LL via the contact hole formed at the insulating layer.

In one embodiment, the low-resistance connecting terminal LLP may have an area size that is larger than the open area OH, and a shape for fully covering the open area OH. Accordingly, in the cross-sectional view, one end (e.g., a first end) of the low-resistance connecting terminal LLP may have a bridge shape in which the low-resistance connecting terminal LLP is connected to one side of the low-resistance line LL, and the other end (e.g., a second end) of the low-resistance connecting terminal LLP may be connected to the other side of the low-resistance line LL. The middle portion of the low-resistance connecting terminal LLP between the ends of the low-resistance connecting terminal LLP may be exposed by the open area OH of the low-resistance line LL as viewing at the direction where the substrate 110 is disposed.

The passivation layer PAS and the planarization layer PL are sequentially stacked on the low-resistance connecting terminal LLP. Particularly, the passivation layer PAS and the planarization layer PL may have a cathode contact hole CON exposing the low-resistance connecting terminal LLP.

In particular, the cathode contact hole CON may have a structure for exposing circumferences of the low-resistance connecting terminal LLP. The middle portions of the low-resistance connecting terminal LLP may be covered by the passivation layer PAS and the planarization layer PL stacked thereon. Further, the passivation layer PAS covering the middle portions may have a first width L1, and the planarization layer PL may have a second width L2. In one embodiment, the first width L1 may be narrower than the second width L2. This shape may be acquired by over-etching the passivation layer PAS than the planarization layer PL. As the result, under-cut area UC may be formed under the planarization layer PL.

As depositing the emission layer EL there-after, the emission layer EL may be deposited on the circumferences of the low-resistance connecting terminal LLP exposed from the planarization layer PL. On the other hand, the emission layer EL may not be deposited at the under-cut area UC, so some portions of the low-resistance connecting terminal LLP may be exposed from the emission layer EL.

Under this condition, as depositing the cathode electrode CAT, the cathode electrode CAT may be stacked on the upper surface of the emission layer EL and the under-cut area UC. As the result, at the under-cut area UC, the cathode electrode CAT may be physically and electrically connected to the low-resistance connecting terminal LLP. The cathode electrode CAT made of transparent conductive material having higher electrical sheet resistance than the metal material may be electrically connected to the low-resistance line LL via the low-resistance connecting terminal LLP. Accordingly, the sheet resistance of the cathode electrode CAT may be lowered.

In the third embodiment, the under-cut area UC may be formed by using the stacked structure of the passivation layer PAS and planarization layer PL at the middle portions of the low-resistance connecting terminal LLP at the cathode contact hole CON. This structure may be more complex than the structure of the under-cut area UC according to the second embodiment. However, for the case in which the cathode contact hole CON is formed at the narrowed space with the ultra-high-resolution structure, the exposed area of the low-resistance connecting terminal LLP in the under-cut area UC may be ensured in maximum.

Further, due to the under-cut area UC formed at the cathode contact hole CON, the cathode electrode CAT may be connected to the low-resistance connecting terminal LLP without conducting the laser process. The third embodiment may provide a structure in which the connectivity may be ensured even when the size of the cathode contact hole CON is smaller as the size of the pixels is decreased and the distance between the pixels is decreased as implementing the ultra-high-resolution electroluminescence display. Even when the low-resistance connecting terminal LLP and the cathode electrode CAT are connected in the under-cut area UC, the contact failure may occur as shown in FIG. 9A. FIG. 9A is an enlarged cross-sectional view illustrating the case of contact failure occurred at the connection part according to the third embodiment.

As the result, the cathode electrode CAT and the low-resistance connecting terminal LLP may not be in contact with each other, or a contact defect in which only a very small area may be in contact may occur even though they are in contact. In order to prevent the contact failure, as shown in FIG. 9B, the laser process may further be conducted to connecting the cathode electrode CAT to the low-resistance connecting terminal LLP where the contact failure is occurred. FIG. 9B is an enlarged cross-sectional view after recovering the contact failure at the connection part of the electroluminescence display according to the third embodiment.

In particular, in the top emission type electroluminescence display according to the third embodiment, in one embodiment for connecting the low-resistance connecting terminal LLP and the cathode electrode CAT, the thermal energy is transferred to the low-resistance connecting terminal LLP, at first, by irradiating the laser from the direction of the substrate 110. In addition, for the case that the repair element is further included in the top emission type electroluminescence display for detouring (or connecting) the defected pixel to the normal pixel, in one embodiment the laser is irradiated from the direction of the substrate 110 during the repair process. Accordingly, in the top emission type electroluminescence display according to the present disclosure, in one embodiment the laser process for connecting the low-resistance connecting terminal LLP to the cathode electrode CAT may be simultaneously conducted with the repair process.

In the third embodiment unlike in the first embodiment, the laser irradiation is not performed at all connection parts J, but the laser irradiation is selectively performed at the connection part J where the connection failure has occurred. Irradiating the laser is to apply the thermal energy to a specific area, so an unwanted defect may occur due to the concentration of high thermal energy. Therefore, it is desirable to reduce the various processes using the laser as much as possible.

The electroluminescence display according to the third embodiment of the present disclosure may have a feature of top emission type in which the cathode electrode CAT is formed of the transparent conductive material. The top emission type may maximize the size of the light emitting diode in the pixel area, and thus has an advantage of providing high luminance even with a small sized pixel. Specifically, since the laser is directly irradiated to the low-resistance connecting terminal from the direction of the substrate, the connection failure may be recovered by using a low-energy laser. During the repair process performed in the video quality inspection process after the electroluminescence display is completely manufactured, the contact defect of the connection part may be also detected and repaired, so the overall manufacturing time may be reduced, and the damages caused by LASER irradiation may be minimized.

Fourth Embodiment

Figure 10:
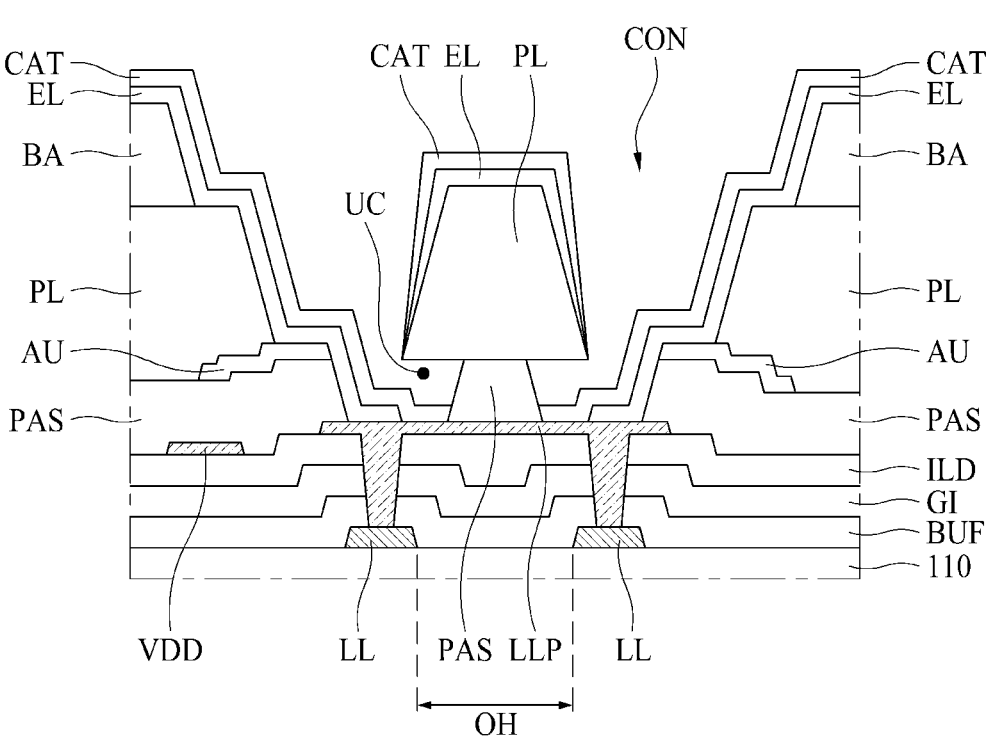
FIG. 10 is an enlarged cross-sectional view illustrating a structure of connection part in the electroluminescence display according to a fourth embodiment of the present disclosure.
Figure 11A:
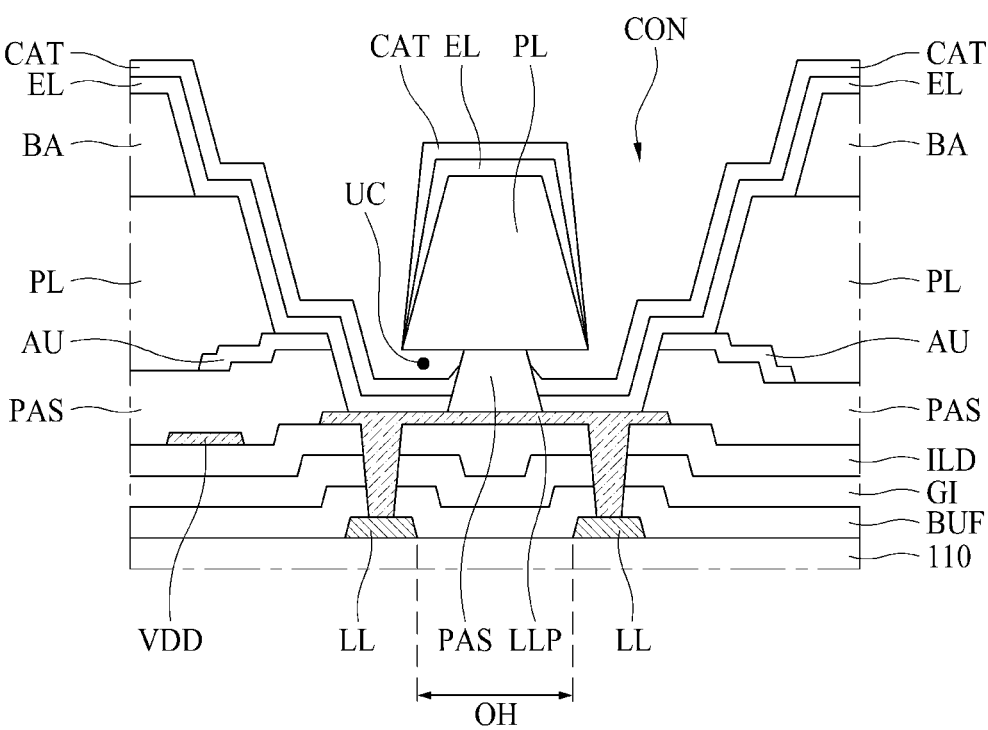
FIG. 11A is an enlarged cross-sectional view illustrating a case in which contact failure occurs at the connection part of the electroluminescence display according to the fourth embodiment of the present disclosure.
Figure 11B:
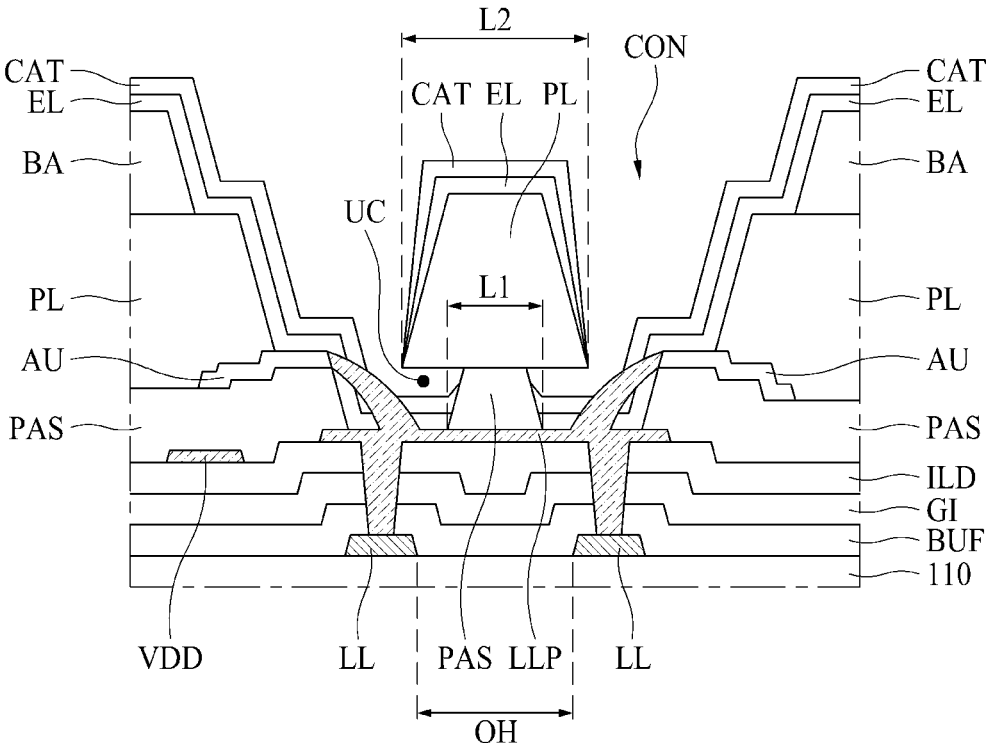
FIG. 11B is an enlarged cross-sectional view after recovering the contact failure at the connection part of the electroluminescence display according to the fourth embodiment of the present disclosure.

Hereinafter, referring to FIGS. 10, 11A and 11B, an electroluminescence display according to the fourth embodiment of the present disclosure will be described. FIG. 10 is an enlarged cross-sectional view illustrating a structure of connection part in the electroluminescence display according to the fourth embodiment of the present disclosure. FIG. 11A is an enlarged cross-sectional view illustrating a case in which contact failure occurs at the connection part of the electroluminescence display according to the fourth embodiment of the present disclosure. FIG. 11B is an enlarged cross-sectional view after recovering the contact failure at the connection part of the electroluminescence display according to the fourth embodiment of the present disclosure. Here, since the cross-sectional structure of other parts except for the connection part J is the same as that of FIG. 10, the entire cross-sectional view is not shown in FIGS. 11A and 11B.

The structure of the connection part in the electroluminescence display according to the fourth embodiment may have very similar with that of the third embodiment. The difference point may be in that an auxiliary electrode AU may be further included between the passivation layer PAS and the planarization layer PL around the low-resistance connecting terminal LLP.

Referring to the cross-sectional view of the connection part J, the low-resistance line LL is disposed on the substrate 110. The low-resistance line LL has an open area OH formed at the connection part J. The insulating layer is deposited on the low-resistance line LL. The insulating layer may include the buffer layer BUF, the gate insulating layer GI and the intermediate insulating layer ILD sequentially stacked on the substrate 110.

The low-resistance connecting terminal LLP is disposed on the insulating layer. In one embodiment, the low-resistance connecting terminal LLP may have an area size that is larger than the open area OH, and a shape for fully covering the open area OH. Accordingly, in the cross-sectional view, one end (e.g., a first end) of the low-resistance connecting terminal LLP may have a bridge shape in which the low-resistance connecting terminal LLP is connected to one side of the low-resistance line LL, and the other end (e.g., a second end) of the low-resistance connecting terminal LLP may be connected to the other side of the low-resistance line LL. The middle portion of the low-resistance connecting terminal LLP may be exposed by the open area OH of the low-resistance line LL as viewing at the direction where the substrate 110 is disposed.

The passivation layer PAS and the planarization layer PL are sequentially stacked on the low-resistance connecting terminal LLP. Particularly, the passivation layer PAS and the planarization layer PL may have a cathode contact hole CON exposing the low-resistance connecting terminal LLP. The cathode contact hole CON may have a structure for exposing circumferences of the low-resistance connecting terminal LLP.

For example, the middle portions of the low-resistance connecting terminal LLP may be covered by the passivation layer PAS and the planarization layer PL stacked thereon. Further, the passivation layer PAS covering the middle portions may have a first width L1, and the planarization layer PL may have a second width L2. In one embodiment, the first width L1 may be narrower than the second width L2. This shape may be acquired by over-etching the passivation layer PAS than the planarization layer PL. As the result, under-cut area UC may be formed under the planarization layer PL.

In addition, an auxiliary electrode AU may be formed between the passivation layer PAS and the planarization layer PL, as having a shape surrounding outer periphery of the low-resistance connecting terminal LLP. In one embodiment, the auxiliary electrode AU may have a structure in which the planarization layer PL is wider than the passivation layer PAS so as to be exposed by the planarization layer PL.

As depositing the emission layer EL there-after, the emission layer EL may be deposited on the circumferences of the low-resistance connecting terminal LLP exposed from the planarization layer PL. On the other hand, the emission layer EL may not be deposited at the under-cut area UC, so some portions of the low-resistance connecting terminal LLP may be exposed from the emission layer EL.

Under this condition, as depositing the cathode electrode CAT, the cathode electrode CAT may be stacked on the upper surface of the emission layer EL and the under-cut area UC. As the result, at the under-cut area UC, the cathode electrode CAT may be physically and electrically connected to the low-resistance connecting terminal LLP. The cathode electrode CAT made of transparent conductive material having higher electrical sheet resistance than the metal material may be electrically connected to the low-resistance line LL via the low-resistance connecting terminal LLP. Accordingly, the sheet resistance of the cathode electrode CAT may be lowered.

According to the fourth embodiment, due to the under-cut area UC formed at the cathode contact hole CON, the cathode electrode CAT may be connected to the low-resistance connecting terminal LLP without conducting the laser process. In the fourth embodiment, even when the low-resistance connecting terminal LLP and the cathode electrode CAT are connected in the under-cut area UC, the contact failure may be occurred as shown in FIG. 11A.

As the result, the cathode electrode CAT and the low-resistance connecting terminal LLP may not be in contact with each other, or a contact defect in which a very small area may be in contact may occur even though they are in contact. In order to prevent the contact failure, as shown in FIG. 11B, the laser process may further be conducted to connecting the cathode electrode CAT to the low-resistance connecting terminal LLP where the contact failure is occurred.

In the fourth embodiment, as the low-resistance connecting terminal LLP is melted by the thermal energy of the laser directly irradiated to the low-resistance connecting terminal LLP through the open area OH, the low-resistance connecting terminal LLP may be connected to the cathode electrode CAT by penetrating the emission layer EL. In particular, the molten low-resistance connecting terminal LLP may be connected to the cathode electrode CAT together with the auxiliary electrode AU disposed around the low-resistance connecting terminal LLP. Therefore, the connection between the molten low-resistance connecting terminal LLP and the cathode electrode CAT may be more reliably and firmly achieved.

In the top emission type electroluminescence display according to the fourth embodiment, in one embodiment for connecting the low-resistance connecting terminal LLP, the auxiliary electrode AU and the cathode electrode CAT, the thermal energy is transferred to the low-resistance connecting terminal LLP, at first, by irradiating the laser from the direction of the substrate 110. In addition, for the case that the repair element is further included in the top emission type electroluminescence display for detouring the defected pixel to the normal pixel, in one embodiment the laser is irradiated from the direction of the substrate 110 during the repair process. Accordingly, in the top emission type electroluminescence display according to the fourth embodiment, in one embodiment the laser process for connecting the low-resistance connecting terminal LLP, the auxiliary electrode AU and the cathode electrode CAT may be simultaneously conducted with the repair process.

In the fourth embodiment unlike in the first embodiment, the laser irradiation is not performed at all connection part J, but the laser irradiation is selectively performed at the connection part J where the connection failure is occurred. Irradiating the laser applies the thermal energy to a specific area, so an unwanted defect may occur due to the concentration of high thermal energy. Therefore, it is desirable to reduce the various processes using the LASER as much as possible.

The electroluminescence display according to the fourth embodiment of the present disclosure may have a feature of top emission type in which the cathode electrode CAT is formed of the transparent conductive material. The top emission type may maximize the size of the light emitting diode in the pixel area, and thus has an advantage of providing high luminance even with a small sized pixel. Specifically, since the laser is directly irradiated to the low-resistance connecting terminal from the direction of the substrate, the connection failure may be recovered by using a low-energy laser. During the repair process performed in the video quality inspection process after the electroluminescence display is completely manufactured, the contact defect of the connection part may be also detected and repaired, so the overall manufacturing time may be reduced, and the damages caused by LASER irradiation may be reduced. By further providing the auxiliary electrode AU, it is possible to more reliably achieve the fusion (or melting) connection between the low-resistance connecting terminal LLP and the cathode electrode CAT by the LASER process.

Fifth Embodiment

Figure 12:
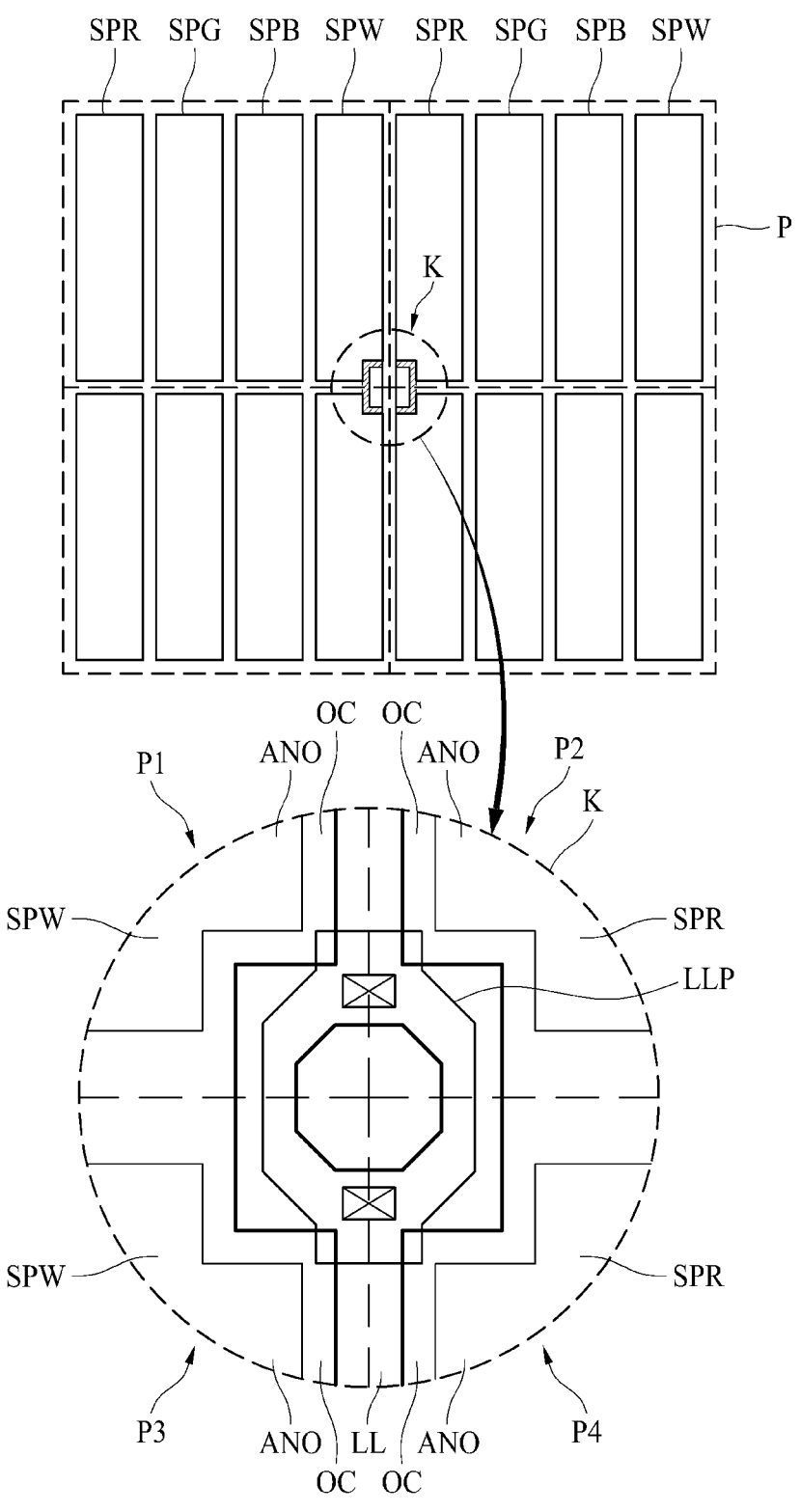
FIG. 12 is a plane view illustrating a structure of the electroluminescence display according to a fifth embodiment of the present disclosure.

Hereinafter, referring to FIG. 12, an electroluminescence display according to the fifth embodiment of the present disclosure will be described. FIG. 12 is a plane view illustrating a structure of the electroluminescence display according to the fifth embodiment of the present disclosure.

The electroluminescence display depicted in FIG. 12 shows a case in which the pixel density is very high. For example, in a case in which an ultra-high-resolution having a pixel density of 200 DPI (dot per inch) or more is implemented in a large-area top emission type electroluminescence display, all sub-pixels SPR, SPG, SPB and SPW disposed in the display area AA may be uniformly spaced apart. In this case, unlike FIG. 1, the spacing between the pixels P may not be wider than that of the sub-pixels SP, but may be set equal to that of the sub-pixels SP. With the structure, since the interval between the sub-pixels SP is very narrow, it may not be easy to form the cathode contact hole CON at one side of the sub-pixels SP.

For the ultra-high-resolution structure, as shown in FIG. 12, the cathode contact hole CON may be disposed at the intersection area K where neighboring four pixels P are met. For example, the cathode contact hole CON may be disposed at the intersection area K where the white sub-pixel SPW of the first pixel P1, the red sub-pixel SPR of the second pixel P2, the white sub-pixel SPW of the third pixel P3 and the red sub-pixel SPR of the fourth pixel P4. In order to dispose the cathode contact hole CON, the intersection area K having a square shape may be set by partially removing the crossing portions of each four sub-pixels.

Then, by patterning the planarization layer PL and the passivation layer PAS, the cathode contact hole CON exposing the low-resistance connecting terminal LLP under the planarization layer PL and the passivation layer PAS may be formed at the intersection area K having the square shape. Here, the cathode contact hole CON may have any one structure according to the first embodiment to the fourth embodiment.

The features, structures, effects and so on described in the above example embodiments of the present disclosure are included in at least one example embodiment of the present disclosure, and are not necessarily limited to only one example embodiment. Furthermore, the features, structures, effects and the like explained in at least one example embodiment may be implemented in combination or modification with respect to other example embodiments by those skilled in the art to which this disclosure is directed. Accordingly, such combinations and variations should be construed as being included in the scope of the present disclosure.

It will be apparent to those skilled in the art that various substitutions, modifications, and variations are possible within the scope of the present disclosure without departing from the spirit and scope of the present disclosure. Therefore, it is intended that embodiments of the present disclosure cover the various substitutions, modifications, and variations of the present disclosure, provided they come within the scope of the appended claims and their equivalents. These and other changes can be made to the embodiments in light of the above detailed description. In general, in the following claims, the terms used should not be construed to limit the claims to the specific example embodiments disclosed in the specification and the claims, but should be construed to include all possible embodiments along with the full scope of equivalents to which such claims are entitled. Accordingly, the claims are not limited by the disclosure.

What is claimed is:

1. An electroluminescence display comprising:
a substrate;
a pixel on the substrate, the pixel including an anode electrode, an emission layer and a cathode electrode;
a low-resistance line at one side of the pixel, the low-resistance line having a first connection part and a second connection part;
an insulating layer on the low-resistance line;
a low-resistance connecting terminal on the insulating layer;
a passivation layer on the low-resistance connecting terminal;
a planarization layer on the passivation layer; and
a cathode contact hole exposing a portion of the low-resistance connecting terminal,
wherein the low-resistance line includes an open area between the first connection part of the low-resistance line and the second connection part of the low-resistance line, the open area overlapping with a middle portion of the low-resistance connecting terminal, the open area lacking a material of the low-resistance line,
wherein the low-resistance connecting terminal is connected to the first connection part and the second connection part of the low-resistance line, and
wherein, at the cathode contact hole, the middle portion of the low-resistance connecting terminal penetrates through the emission layer and is connected to the cathode electrode.

2. The electroluminescence display according to claim 1, wherein the cathode contact hole penetrates through the passivation layer and the planarization layer to expose the portion of low-resistance connecting.

3. The electroluminescence display according to claim 1, wherein the cathode contact hole includes:
a first contact hole in the planarization layer, and the first contact hole having a first width; and
a second contact hole in the passivation layer, and the second contact hole having a second width that is greater than the first width,
wherein the emission layer is deposited on the middle portion of the low-resistance connecting terminal exposed by the second contact hole having the second width, and
wherein the cathode electrode is disposed in the first contact hole having the first width and connected to a circumference of the low-resistance connecting terminal exposed by the second contact hole having the second width.

4. The electroluminescence display according to claim 1, wherein the cathode contact hole includes a first pattern and a second pattern overlapping the middle portion of the low-resistance connecting terminal, and
wherein a first width of the first pattern is narrower than a second width of the second pattern to form an under-cut area under the planarization layer.

5. The electroluminescence display according to claim 4, wherein at the first connection part, the cathode electrode is connected to the low-resistance connecting terminal exposed at the under-cut area.

6. The electroluminescence display according to claim 1, wherein, at the second connection part, the emission layer is on the low-resistance connecting terminal exposed from the cathode contact hole and the cathode electrode is on the emission layer such that the cathode electrode is farther from the low-resistance connecting terminal than the emission layer, and the low-resistance connecting terminal is connected to the cathode electrode at the second connection part by being melted to penetrate through the emission layer.

7. The electroluminescence display according to claim 6, further comprising:
an auxiliary electrode between the passivation layer and the planarization layer, the auxiliary electrode surrounding the low-resistance connecting terminal,
wherein, at the second connection part, the low-resistance connecting terminal is connected to the auxiliary electrode and the cathode electrode by being melted to penetrate through the emission layer.

8. The electroluminescence display according to claim 1, wherein the low-resistance connecting terminal connects the low-resistance line to the cathode electrode at the open area.

9. The electroluminescence display according to claim 8, wherein the open area has a width that is narrower than a width of the low-resistance line, the open area comprising a polygon shape, a circle shape, or an ellipse shape.

10. The electroluminescence display according to claim 1, wherein a width of the low-resistance connecting terminal is wider than a width of the low-resistance line, the low-resistance connecting terminal overlapping all of the open area.

11. The electroluminescence display according to claim 1, further comprising:
a buffer layer covering the low-resistance line on the substrate; and
a thin film transistor disposed between the buffer layer and the passivation layer,
wherein the low-resistance connecting terminal penetrates through the insulating layer and is connected to the low-resistance line.

12. The electroluminescence display according to claim 11, wherein the thin film transistor includes:
a semiconductor layer on the buffer layer;
a gate insulating layer on the semiconductor layer;
a gate electrode overlapped with the semiconductor layer on the gate insulating layer;
an intermediate insulating layer on the gate electrode;
a source electrode connected to a first side of the semiconductor layer on the intermediate insulating layer; and
a drain electrode connected to a second side of the semiconductor layer on the intermediate insulating layer,
wherein a portion of the low-resistance connecting terminal is on a same layer as the source electrode and the drain electrode, and the low-resistance connecting terminal penetrates through the buffer layer, the gate insulating layer, and the intermediate insulating layer to connect to the low-resistance line.

13. The electroluminescence display according to claim 1, wherein a plurality of connection parts are arranged along the low-resistance line at predetermined intervals.

14. The electroluminescence display according to claim 1, wherein the pixel includes a plurality of pixels arranged in a matrix manner having a plurality of rows and a plurality of columns, wherein at least one pixel in the plurality of pixels includes:

a red sub-pixel;

a green sub-pixel;

a blue sub-pixel; and a white sub-pixel.

15. The electroluminescence display according to claim 14, wherein the first connection part and the second connection part are disposed at an intersection area of four pixels in the plurality of pixels, the four pixels neighboring each other.

16. The electroluminescence display according to claim 14, wherein the low-resistance line is arranged one by one for every predetermined number of columns in the plurality of columns.

17. An electroluminescence display comprising:

a substrate;

a low-resistance line on the substrate, the low-resistance line including a first connection part, a second connection part, and an open area between the first connection part and the second connection part, the open area lacking a material of the low-resistance line;

a low-resistance connecting terminal connected to the first connection part and the second connection part of the low-resistance line;

a pixel including an anode electrode, an emission layer, and a cathode electrode, the anode electrode non-overlapping with the low-resistance line;

a passivation layer on the low-resistance connecting terminal;

a planarization layer on the passivation layer; and a contact hole through a portion of the passivation layer and a portion of the planarization layer that overlaps the low-resistance connecting terminal, wherein a portion of the emission layer is disposed in the contact hole such that the portion of the emission layer is between a first portion of the low-resistance connecting terminal and a portion of the cathode electrode that is disposed in the contact hole, and a second portion of the low-resistance connecting terminal penetrates through the portion of the emission layer and is connected to the portion of the cathode electrode that is disposed in the contact hole, and wherein the second portion of the low-resistance connecting terminal connected to the portion of the cathode electrode that is disposed in the contact hole is formed via laser applied to the open area.

18. The electroluminescence display of claim 17, further comprising:

an auxiliary electrode between the passivation layer and the planarization layer, the auxiliary electrode surrounding the low-resistance connecting terminal, wherein the second portion of the low-resistance connecting terminal is connected to the auxiliary electrode and the portion of the cathode electrode that is disposed in the contact hole.

* * * * *